United States Patent [19]

Kitazawa

[11] Patent Number: 4,795,901
[45] Date of Patent: Jan. 3, 1989

[54] ANALOG TRIANGULAR WAVE OUTPUT ENCODER

[75] Inventor: Hisasi Kitazawa, Toyookamura, Japan

[73] Assignee: Tamagawa Seiki Kabushiki Kaisha, Tokyo, Japan

[21] Appl. No.: 51,923

[22] Filed: May 19, 1987

[30] Foreign Application Priority Data

May 28, 1986 [JP] Japan .................. 61-120963

[51] Int. Cl.$^4$ .............................. G01D 5/34
[52] U.S. Cl. .................. 250/231 SE; 250/237 G
[58] Field of Search ............ 250/231 SE, 237 G; 324/175; 340/347 P

[56] References Cited

U.S. PATENT DOCUMENTS

| | | | |
|---|---|---|---|
| 4,621,256 | 11/1986 | Rusk | 250/231 SE |
| 4,680,466 | 7/1987 | Kuwahara et al. | 340/347 P |
| 4,701,615 | 10/1987 | Schmitt | 340/347 P |
| 4,703,309 | 10/1987 | Krohn | 250/231 SE |

*Primary Examiner*—Edward P. Westin
*Attorney, Agent, or Firm*—Brooks Haidt Haffner & Delahunty

[57] ABSTRACT

An analog triangular wave output encoder capable of producing a continuous triangular wave output is disclosed. The encoder has a rotary disk attached to a rotary shaft mounted for rotation relative to a base block, a light emittimg element on one side of the rotary disk and facing it, a fixed slit plate on the other side of the rotary disk and having a fixed slit part, a light receiving element facing the fixed slit plate, a series of first slits formed in the fixed slit part for producing first output signals and a series of second slits formed in the fixed plate for producing second output signals. The first and the second slits are displaced 90° in phase in the rotational direction of the rotary disk so that trapezoidal wave outputs produced from the slits with a phase shift of 90° from each other are combined at the light receiving element into a continuous traingular output signal.

4 Claims, 5 Drawing Sheets

ANALOG TRIANGULAR WAVE OUTPUT ENCODER

BACKGROUND OF THE INVENTION

1. Field of the Invention

This invention relates to an analog triangular wave output encoder and more particularly to such an encoder in which the analog triangular wave can be obtained by simply changing the light receiving pattern of the fixed slit plate without changing the processing circuit.

2. Prior Art

As the encoder of the above type, there has been proposed and adopted an optical rotary encoder having a structure as shown in FIG. 5. The light receiving masks in the fixed slit plate in such optical rotary encoder are formed with an equal one-pitch interval as shown in FIG. 10.

Hence, the output signals obtained from the slits 1 of the light receiving mask patterns of the aforementioned slit plate are in the form of a sinusoidal wave approximate to a trapezoidal wave, although this has not been specifically indicated in prior art literature.

In the above described conventional encoder, the output waveform presents a linearity only for a range of about 60 percent of the output voltage Vpp. When it is desired to elevate the range of linearity to higher than 60% it has been necessary to modify not only the processing circuit for the output signals, but also the structure of the encoder itself. This results in significantly elevated manufacturing costs of the analog triangular wave output encoder.

SUMMARY OF THE INVENTION

It is a principal object of the present invention to overcome the aforementioned problem of the prior art encoder having an improved linearity simply by changing the slit pattern of the fixed slit plate.

In accordance with the present invention, there is provided an analog triangular wave output encoder comprising a rotary disk attached to a rotary shaft mounted for rotation in a base block, a light emitting element on one side of said rotary disk facing said disk, a fixed slit plate on the other side of said rotary disk having a fixed slit part, a light receiving element facing said fixed slit plate, a series of first fixed slits formed in said fixed slit part for producing first output signals, and a series of second fixed slits formed in said fixed slit part for producing second output signals, said first fixed slits being displaced 90° in phase from said second fixed slits in the rotational direction of said rotary disk such that trapezoidal wave output components produced by said slits with a phase shift of 90° from each other are combined at said light receiving element into a continuous substantially triangular output signal.

In the analog triangular wave output encoder of the present invention, since the first and second slits are 90° out of phase relative to each other, the light transmitted through these slits fall on the light receiving element to produce a first output wave signal component and the a second output wave signal component having a phase shift of 90° from each other so that an analog triangular wave signal output with improved sharpness and linearity can be obtained very easily without the necessity of providing any additional electrical processing means with the result that manufacturing costs of the encoder are significantly lowered. Thus the analog triangular wave signal output is produced simply by changing the light receiving pattern of the fixed slit plate and without the need of using conventional electrical synthesizing means.

BRIEF DESCRIPTION OF THE DRAWINGS

FIGS. 1 through 9 illustrate the analog triangular wave output encoder according to the present invention, wherein FIG. 1 shows the output waveform obtained by the encoder.

FIGS. 2 through 4 are diagrammatic views showing three different types of the light receiving mask patterns of the fixed slit plate employed in the encoder of the present invention.

FIG. 5 is a sectional view showing the overall arrangement of the encoder.

FIG. 6 is a plan view showing the fixed slit plate.

FIG. 7 is an enlarged plan view showing essential parts of FIG. 6.

FIG. 8 is an enlarged plan view showing a rotary disk.

FIG. 9 is an enlarged partial plan view showing essential parts of FIG. 8.

DESCRIPTION OF A PREFERRED EMBODIMENT

Figure 5:
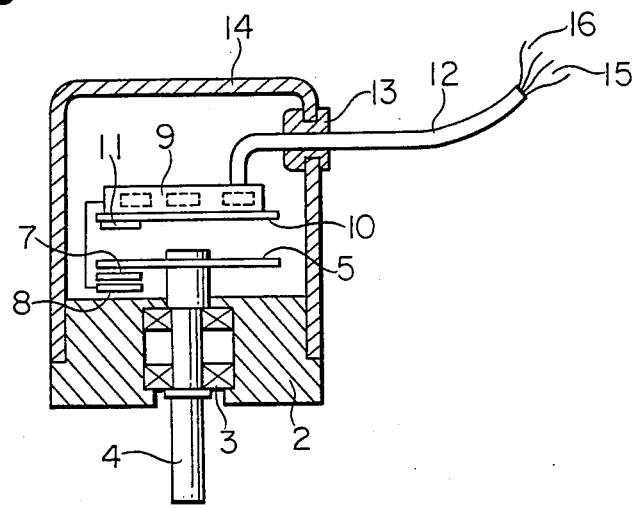

Referring to the accompanying drawings, preferred embodiments of the analog triangular wave output encoder according to the present invention will be described in detail. FIG. 5 shows the overall structure of the analog triangular wave output encoder.

In this figure, the numeral 2 designates a base block. To this base block 2, a rotary shaft is rotatably mounted by means of a bearing 3, and a rotary disk 5 is mounted integrally on the end of the rotary shaft 4.

A fixed slit plate 7 having a fixed slit part 6 is mounted on one side of the rotary disk 5, and a light receiving element 8 is mounted below and in opposition to the slit plate 7.

On the other side of and in opposition to the rotary disk 5, a printed circuit board 10 having an electronic circuit part 9 is secured by any suitable securing means, not shown. On the lower surface of the printed circuit board 10, a light emitting element 11 is mounted at a position in register with the fixed slit plate 7 and the light receiving element 8.

A casing 14 having a connecting cord 12 mounted thereto through a bus 13 is fitted to the base block 2. An electrical conductor 15 connected to a power source, not shown and another electrical conductor 16 for supplying output signals is enclosed in the connecting cord 12.

Figure 8:
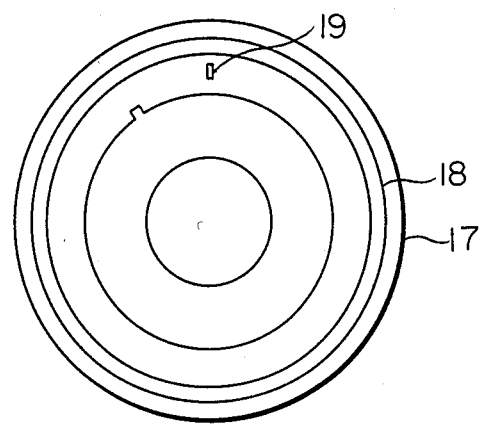
Figure 9:
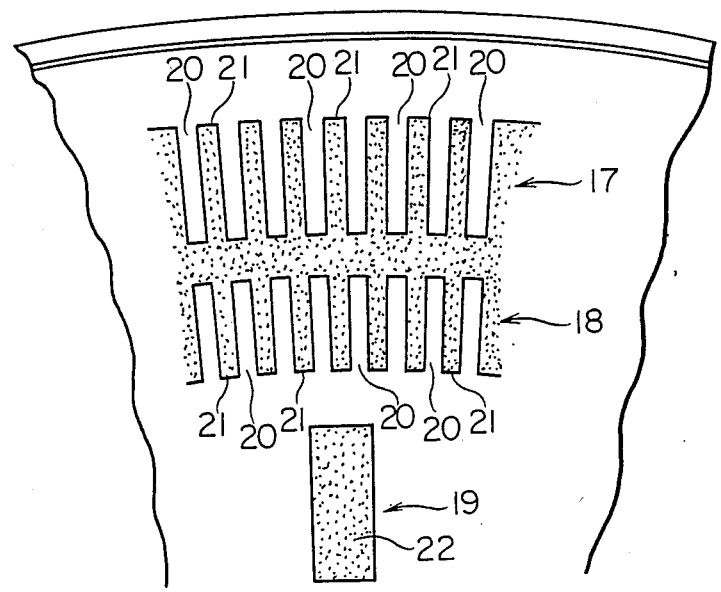
Figure 10:
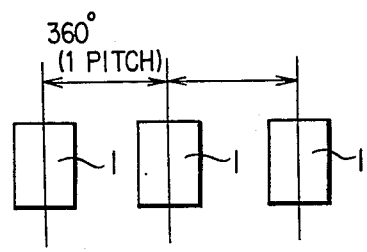
FIG. 10 is a diagrammatic view showing the light-receiving pattern of the fixed slit part employed in the conventional encoder.
Figure 11:
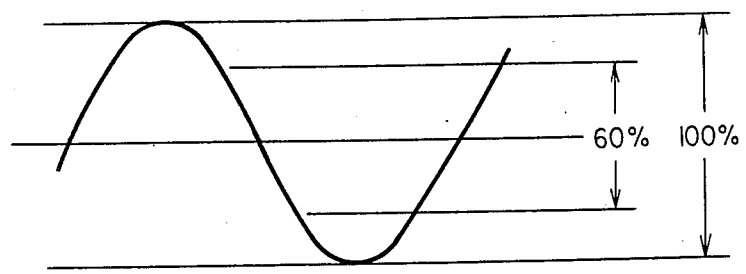
FIG. 11 is a waveform diagram showing the conventional output waveform.

The rotary disk 5 is shown in more detail in FIGS. 8 and 9. The disk 5 is formed of glass, and by etching a metalized layer a first track 17 and a second track 18 are formed on the peripheral part of the disk 5. A third track 19 adapted for producing a pulse is formed inwardly of the second track 18.

These tracks 17, 18 and 19 are constructed as shown in FIG. 9. The first and second tracks 17 and 18 are formed by a series of light interrupting sections 20 formed in turn by etching nickel or stainless steel plates and applying chromium coating layers, while a series of light transmitting sections 21 are continuously formed at a prescribed constant interval between these adjoining light interrupting layers 20.

The third track 19 is formed by a light transmitting section 22 from which a single pulse is produced.

Figure 6:
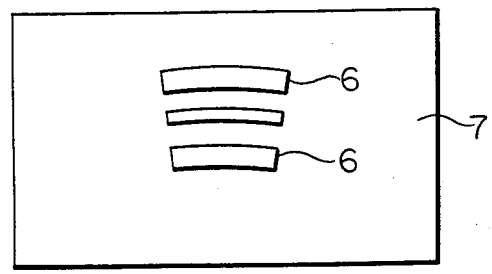
Figure 7:
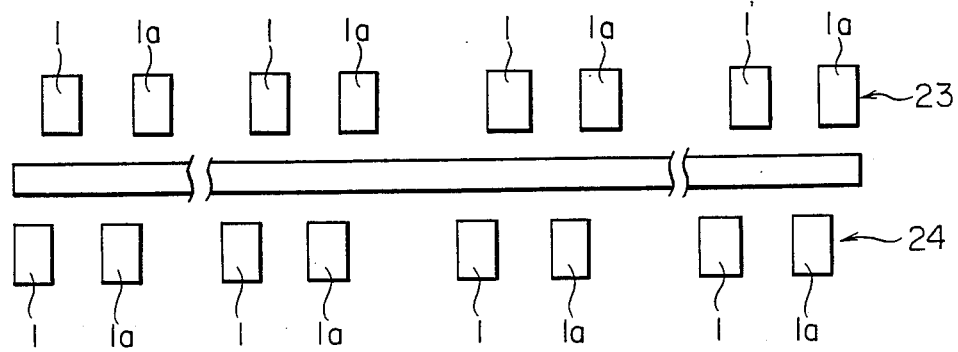

The fixed slit part 6 in the aforementioned fixed slit plate 7 shown in FIG. 6 is shown in more detail in FIG. 7. Thus it is constructed of a first fixed track 23 and a second fixed track 24, each of which is formed by plural first slits 1 and plural second slits 1a.

Figure 2:
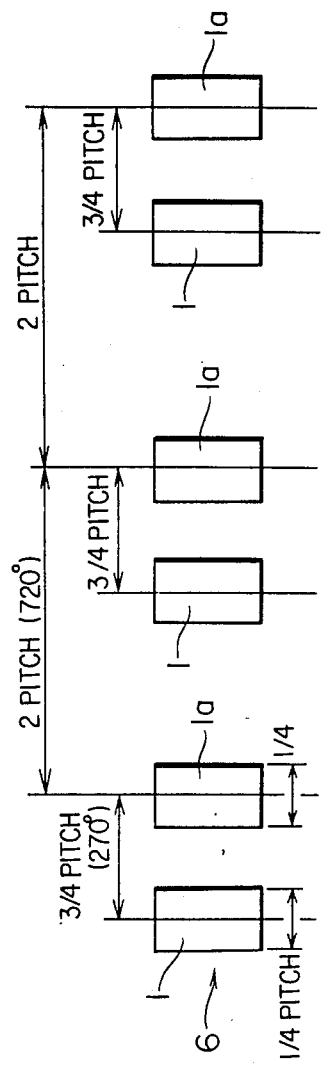
Figure 3:
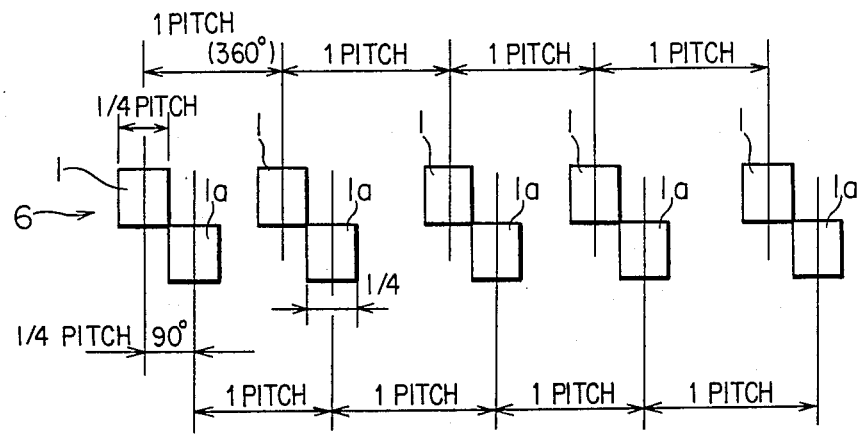
Figure 4:
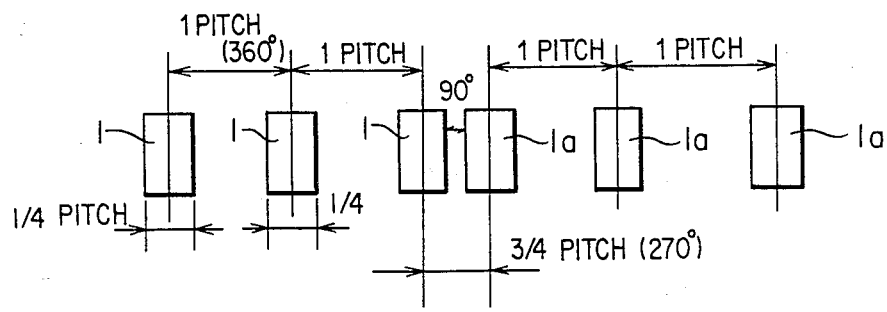

The first and the second fixed tracks 23 and 24 are endowed with the same light-receiving mask patterns, as shown by way of examples in FIGS. 2 through 4.

FIG. 2 shows the structure of the light-receiving mask pattern of FIG. 7 in more detail. Thus the first slits 1 are formed at an angulars interval and in alternation to the second slits 1a.

FIG. 3 shows the structure of the light-receiving mask pattern in which the first slits 1 and the second slits 1a are formed in an upper row and lower row, respectively, and with an angular interval of 90° from each other.

FIG. 4 shows the structure of the light-receiving mask pattern in which the pattern is divided at the center into a first group of three first slits 1 and a second group of three second slits 1a.

The above described analog triangular wave output encoder operates as follows:

The fixed slit plate 7 may have the first slits 1 and the second slits 1a of any of the light receiving mask patterns shown in FIGS. 2 to 4. The base block 2 is mounted to a rotary part, not shown, of a machine tool, and the rotary shaft 4 is coupled to the rotary part for causing rotation of the disk 5.

In this state, the light emitted from the light emitting element 11 is transmitted through the light transmitting sections 21 of the first track 17 and the second track 18 of the rotary disk 5 and thence through the first and the second slits 1, 1a of the fixed slit plate 7 to be incident on the light receiving element 8.

Figure 1:
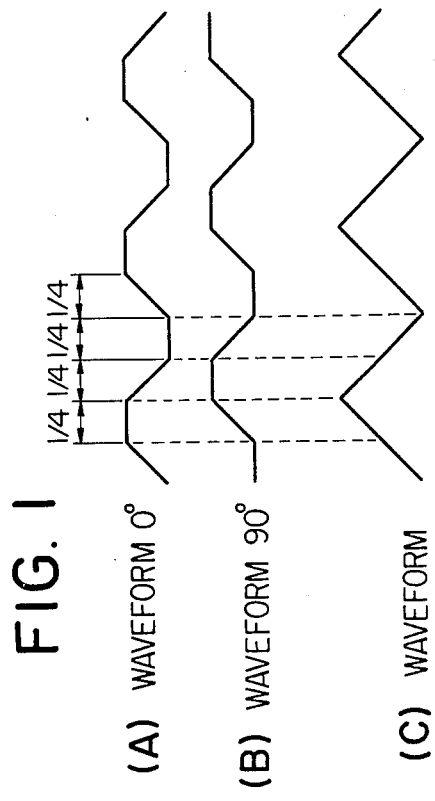

The output waveform generated by the light thus incident on the light receiving element 8 is composed of a waveform A as a first output signal component caused by the light transmitted through the first slit 1 and a waveform B as a second output signal component caused by the light transmitted through the second slit 1a, as shown in FIG. 1. The waveform B is displaced by 90° with respect to the waveform A, so that, when these waveforms A and B are combined together at the light receiving element 8, a resultant wave having the analog triangular waveform having an optimum linearity is produced, as shown at C in FIG. 1.

Although the foregoing description has been made of the light receiving mask patterns of the fixed slit plate 7 shown for example in FIGS. 2 to 4, the present invention is not limited to these specific embodiments, but may cover any alternative arrangement in which the light-receiving mask pattern of the slits are not shown herein but may produce output waveforms 90° dephased relative to each other.

What is claimed is:

1. An analog triangular wave output encoder comprising a rotary disk attached to a rotary shaft mounted for rotation in a base block, said rotary disk being provided with a circumferential array of spaced apart light transparent slits, a light emitting element on one side of said rotary disk facing said disk a fixed slit plate on the other side of said rotary disk having a fixed slit part, a light receiving element facing said fixed slit plate on the opposite side of said fixed slit plate from said rotary disk, a first and second series of fixed slits formed in said fixed slit part, said series of first and second fixed slits in said fixed slit part being in alignment with said slits in said rotary disk and related thereto for modulating light passing from said light emitting element through said rotary disk slits and said fixed slits of said fixed slit plate to said light receiving element to produce, respectively, first and second trapezoidal wave signal components, said first series of fixed slits being displaced from said second series of fixed slits in the rotational direction of said rotary disk such that said first and second trapezoidal wave signal components are produced by said slits with an electrical phase shift of 90° from each other and are combined at said light receiving element into a continuous substantially triangular output signal.

2. An analog triangular wave output encoder according to claim 1, wherein said first and second series of fixed slits are formed at an upper position and a lower position relative to each other.

3. An analog triangular wave output encoder according to claim 1, wherein said first series of fixed slits and said second series of fixed slits are located in two groups, respectively, one group being to one side and the other group being to the opposite side of a dividing line, one of said groups being shifted with reference to said rotary disk slits relative to the relation of said other group to said rotary disk slits.

4. An analog triangular wave output encoder according to claim 1, wherein said first series of fixed slits and said second series of fixed slits are formed with all of said first series of fixed slits spaced apart and all of said second series of fixed slits spaced apart at the same predetermined interval but with said first series of fixed slits shifted relative to said second series of fixed slits.

* * * * *